United States Patent
Song et al.

(10) Patent No.: US 8,199,600 B2
(45) Date of Patent: Jun. 12, 2012

(54) VOLTAGE GENERATOR FOR PERIPHERAL CIRCUIT

(75) Inventors: Ho-Uk Song, Kyoungki-do (KR); Jong-Won Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 530 days.

(21) Appl. No.: 11/529,421

(22) Filed: Sep. 27, 2006

(65) Prior Publication Data

US 2007/0070772 A1 Mar. 29, 2007

(30) Foreign Application Priority Data

Sep. 28, 2005 (KR) .................. 10-2005-0090843
Dec. 15, 2005 (KR) .................. 10-2005-0123980

(51) Int. Cl.
*G11C 5/14* (2006.01)

(52) U.S. Cl. .............. 365/226; 365/189.09; 327/538

(58) Field of Classification Search .............. 365/226, 365/228, 189.11, 189.09, 227; 327/540, 327/538, 541
See application file for complete search history.

(56) References Cited

U.S. PATENT DOCUMENTS

| | | | | |
|---|---|---|---|---|
| 5,373,477 A * | 12/1994 | Sugibayashi | .............. | 365/226 |
| 5,978,299 A | 11/1999 | Yamasaki et al. | | |
| 6,111,395 A * | 8/2000 | Hirade et al. | .............. | 323/273 |
| 6,222,275 B1 * | 4/2001 | Keeth | .............. | 257/776 |
| 6,385,115 B1 * | 5/2002 | Nakai | .............. | 365/226 |
| 6,584,020 B2 | 6/2003 | Yamauchi et al. | | |
| 6,721,211 B2 | 4/2004 | Lee et al. | | |
| 6,753,720 B2 * | 6/2004 | Kono et al. | .............. | 327/538 |
| 6,853,567 B2 | 2/2005 | Kwon | | |
| 6,876,585 B2 | 4/2005 | Choi et al. | | |
| 6,954,103 B2 * | 10/2005 | Yamauchi et al. | .............. | 327/540 |
| 6,958,947 B2 | 10/2005 | Park et al. | | |
| 7,859,325 B2 * | 12/2010 | Chiu et al. | .............. | 327/540 |
| 2003/0214345 A1 * | 11/2003 | Yamauchi et al. | .............. | 327/530 |
| 2004/0001386 A1 * | 1/2004 | Park | .............. | 365/227 |
| 2005/0094479 A1 | 5/2005 | Kim et al. | | |
| 2008/0012629 A1 * | 1/2008 | Byeon et al. | .............. | 327/538 |

FOREIGN PATENT DOCUMENTS

| | | |
|---|---|---|
| JP | 9-7370 A | 1/1997 |
| JP | 2000-57767 A | 2/2000 |
| JP | 2001-76486 | 3/2001 |
| JP | 2003-85977 A | 3/2003 |
| KR | 2000-0065430 | 11/2000 |
| KR | 10-2004-0046019 | 6/2004 |
| TW | 583682 | 4/2004 |
| TW | 1229349 | 3/2005 |

* cited by examiner

*Primary Examiner* — Douglas King
(74) *Attorney, Agent, or Firm* — Blakely, Sokoloff, Taylor & Zafman

(57) ABSTRACT

A voltage generator for a peripheral circuit, the voltage generator includes: a voltage supplier supplying a peripheral circuit voltage having a voltage level maintained at a reference voltage level, the peripheral circuit voltage outputted in response to a driving signal; and a voltage level compensator increasing the voltage level of the peripheral circuit voltage in response to a column path command.

6 Claims, 4 Drawing Sheets

… (1, 2)

VOLTAGE GENERATOR FOR PERIPHERAL CIRCUIT

FIELD OF THE INVENTION

The present invention relates to a semiconductor memory device, and more particularly, to a voltage generator used in a peripheral circuit.

DESCRIPTION OF RELATED ARTS

Many researchers have focused on achieving low power consumption in a semiconductor memory device for mobile apparatuses. However, it is necessary to consider the fact that an external voltage level becomes unstable depending on a voltage level of a peripheral circuit due to the limited use of power.

FIG. 1 illustrates a circuit diagram of a conventional voltage generator for a peripheral circuit.

The voltage generator is activated by a driving signal EN. Also, the voltage generator generates a control signal CTR to sustain a feedback voltage VPERI_FD of a peripheral circuit voltage VPERI higher than a reference voltage REF and provides the peripheral circuit voltage VPERI.

FIG. 2 illustrates the peripheral circuit voltage VPERI depending on that of an external power supply voltage VDD, wherein the voltage generator illustrated in FIG. 1 generates the peripheral circuit voltage VPERI based on the external power supply voltage VDD.

The peripheral circuit voltage VPERI reaches a plateau at 1.8V even if the voltage level of the external power supply voltage VDD increases continuously. This behavior is specifically to lower an amount of a driving current. For reference, the peripheral circuit voltage is applied to row and column control units, decoders, data transferring paths and so on except for core memory blocks.

The conventional voltage generator for the peripheral circuit usually restricts the voltage level of the peripheral circuit voltage to a certain level to minimize the amount of the driving current. Thus, when a large amount of current is dissipated while performing read and write operations, the voltage level of the external power supply voltage tends to be unstable. Furthermore, since the voltage generator for the peripheral circuit is disposed in a specifically designated portion of the semiconductor memory device, those devices located away from the voltage generator often receive a lowered level of the peripheral circuit voltage.

SUMMARY OF THE INVENTION

It is, therefore, an object of the present invention to provide a voltage generator for a peripheral circuit of a semiconductor memory device, wherein the voltage generator can supply a stabilized peripheral circuit voltage regardless of internal device operations and device arrangements.

In accordance with an aspect of the present invention, there is provided a voltage generator for a peripheral circuit, the voltage generator including: a voltage supplier supplying a peripheral circuit voltage having a voltage level maintained at a reference voltage level, the peripheral circuit voltage outputted in response to a driving signal; and a voltage level compensator increasing the voltage level of the peripheral circuit voltage in response to a column path command.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A voltage generator for a peripheral circuit in accordance with various embodiments of the present invention will be described in detail with reference to the accompanying drawings.

Figure 1:
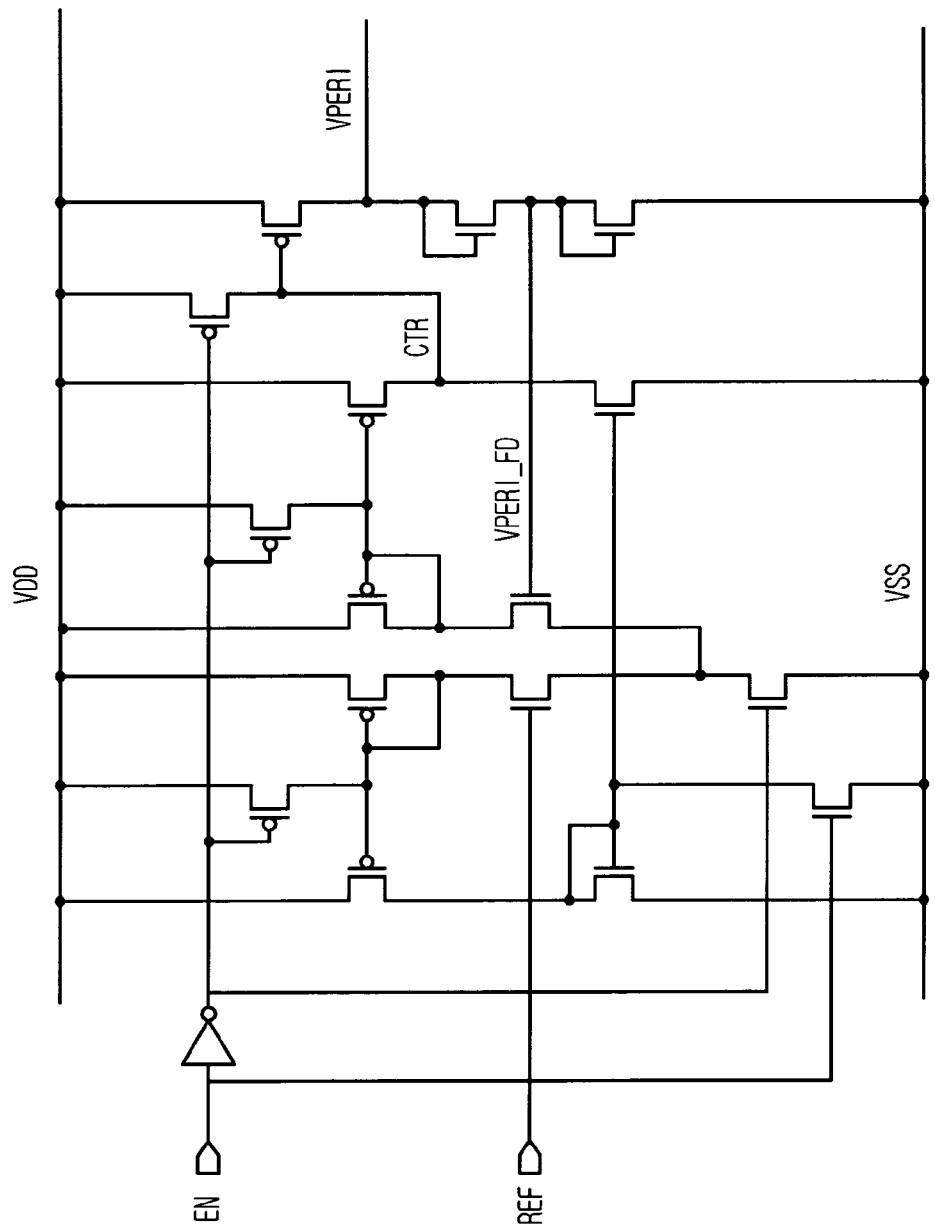
FIG. 1 illustrates a circuit diagram of a conventional voltage generator for a peripheral circuit.
Figure 2:
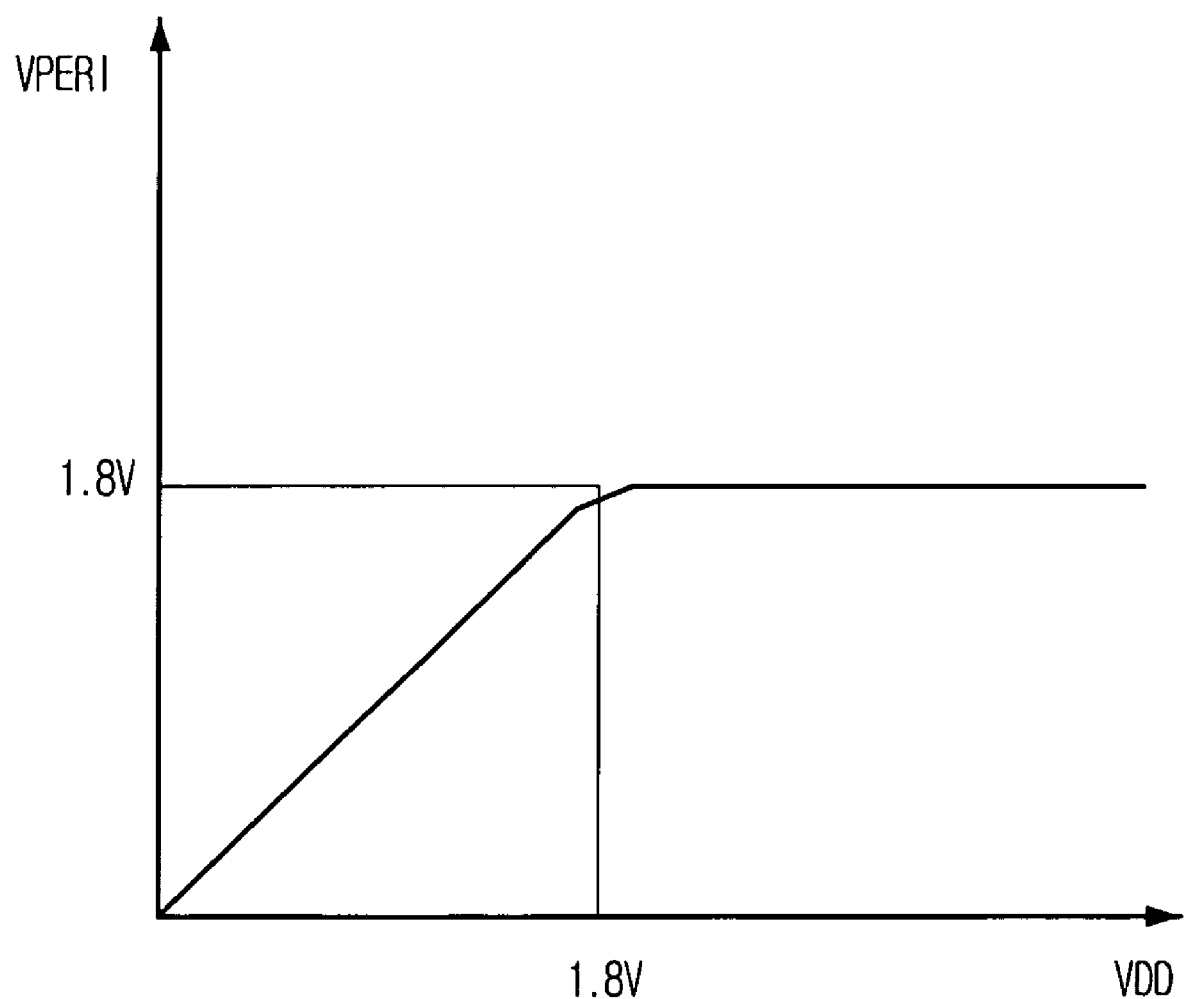
FIG. 2 illustrates a graph of a voltage level of a peripheral circuit voltage generated according to an external power supply voltage.
Figure 3:
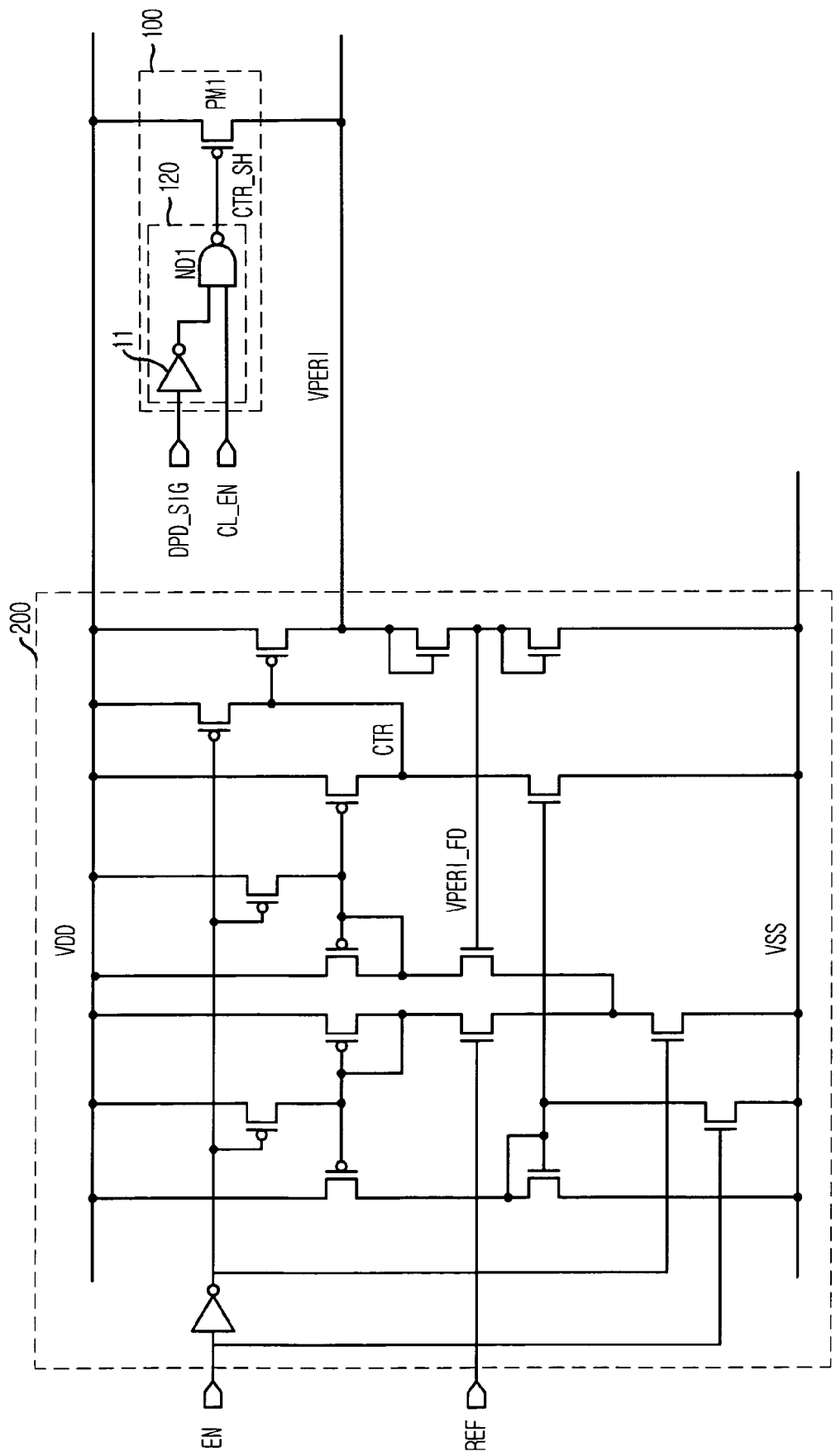
FIG. 3 illustrates a circuit diagram of a voltage generator for a peripheral circuit in accordance with an embodiment of the present invention.

FIG. 3 illustrates a simplified circuit diagram of a voltage generator for a peripheral circuit in accordance with an embodiment of the present invention.

The voltage generator includes a voltage level compensator 100 and a voltage supplier 200. The voltage level compensator 100 is configured to temporarily increase a voltage level of a peripheral circuit voltage VPERI in response to a column path command CL_EN. The voltage supplier 200 is configured to sustain a feedback voltage VPERI_FD level of the peripheral circuit voltage VPERI substantially the same as a reference voltage REF level. The peripheral circuit voltage VPERI is outputted in response to a driving signal EN. The column path command CL_EN is enabled when a write command and a read command RD (see FIG. 4) are supplied.

Particularly, the voltage level compensator 100 drives a terminal connected to the peripheral circuit voltage VPERI with a voltage applied to a terminal connected to an external power supply voltage VDD during the activation of the column path command CL_EN, and stops supplying the external power supply voltage VDD when a deep power down mode signal DPD_SIG is enabled.

The voltage level compensator 100 includes a driving unit PM1 and a control unit 120. The driving unit PM1 drives the terminal connected to the peripheral circuit voltage VPERI with the voltage applied to the terminal connected to the external power supply voltage VDD. The control unit 120 controls the driving unit PM1 in response to the deep power down mode signal DPD_SIG and the column path command CL_EN.

The control unit 120 includes an inverter 11 and a NAND gate ND1. The inverter 11 inverts the deep power down mode signal DPD_SIG, and the NAND gate ND1 receives the column path command CL_EN and an output signal of the inverter 11 and outputs a driving control signal CTR_SH.

The driving unit PM1 includes a P-channel metal-oxide semiconductor (PMOS) transistor, which has a gate receiving the driving control signal CTR_SH and is coupled between the terminal connected to the external power supply voltage VDD and the terminal connected to the peripheral circuit voltage VPERI.

Figure 4:
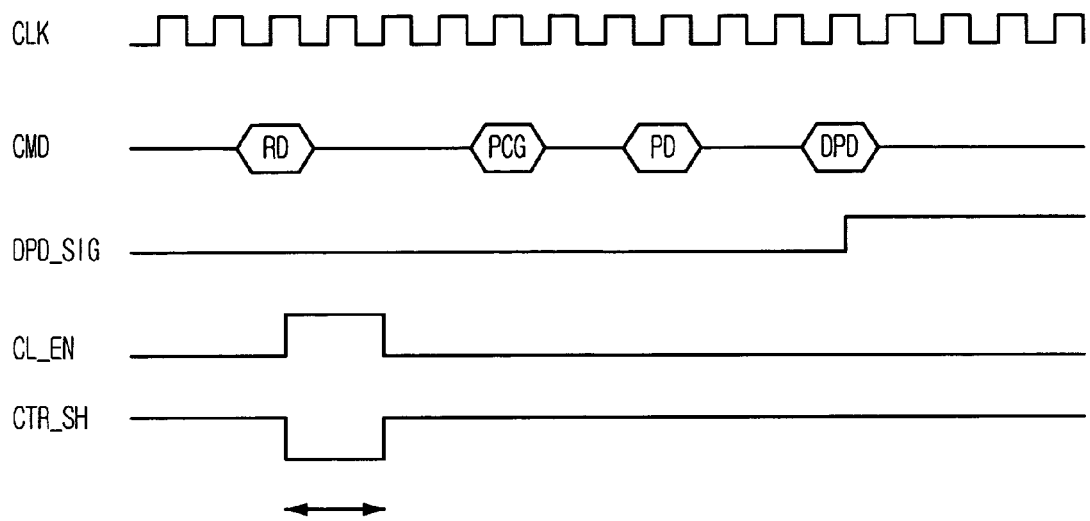
FIG. 4 provides an operational waveform diagram of the voltage generator illustrated in FIG. 3.

FIG. 4 provides an operational waveform diagram of the voltage generator illustrated in FIG. 3. With reference to FIG. 4, operation of the voltage generator will be described in detail.

If the read command RD is inputted, the column path command CL_EN becomes enabled. Thus, the control unit 120 of the voltage level compensator 100 generates the driving control signal CTR_SH enabled to a logic low level 'L'. The driving unit PM1 is activated in response to the enabled driving control signal CTR_SH and thus, drives the terminal connected to the peripheral circuit voltage VPERI with the external power supply voltage VDD.

If a deep power down mode command DPD is inputted, the deep power down mode signal DPD_SIG is enabled to a logic high level 'H', and the control unit 120 disables the driving control signal CTR_SH to turn off the driving unit PM1.

The voltage generator for the peripheral circuit in the present embodiment detects the case where a large amount of current is consumed, e.g., read and write operations, by using the voltage level compensator 100 activated during the read and write operations, and connects the terminal connected to the external power supply voltage VDD with the terminal connected to the peripheral circuit voltage VPERI. As a result, the peripheral circuit voltage VPERI and the external power supply voltage VDD are less likely to drop down. For reference, the voltage drop down incidence usually occurs during the column path operation.

In such a mode that requires the minimization of the power consumption, e.g., the deep power down mode, the driving unit PM1 of the voltage level compensator 100 is turned off to avoid unnecessary power consumption.

Figure 5:
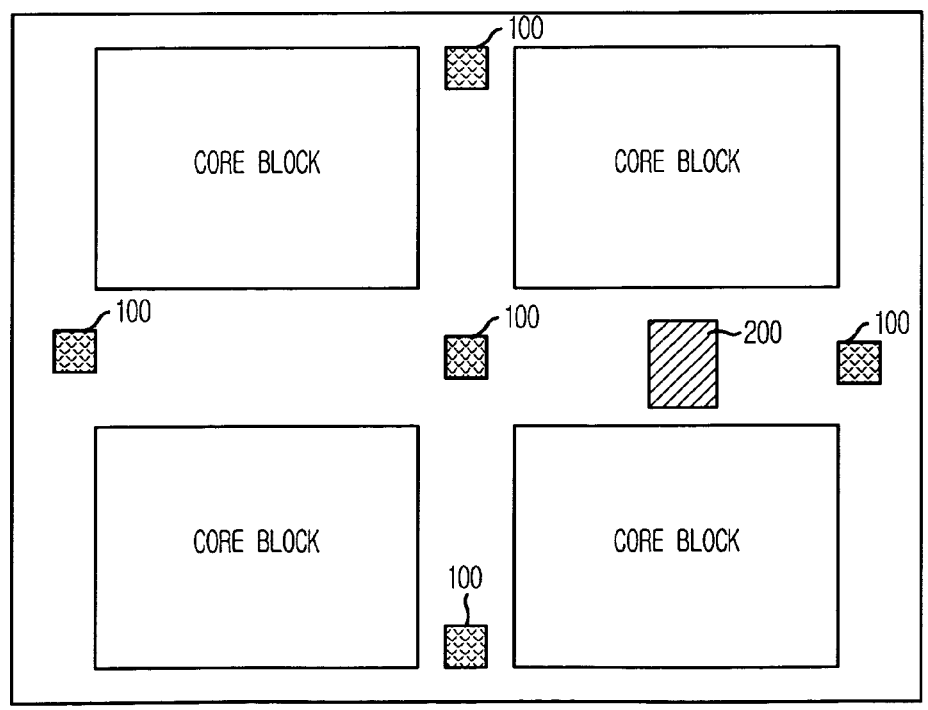
FIG. 5 depicts a chip layout of a voltage generator for a peripheral circuit in accordance with an embodiment of the present invention.

FIG. 5 depicts a layout of the voltage generator for the peripheral circuit in accordance with an embodiment of the present invention.

The voltage supplier 200 is disposed in a predetermined region of a target device structure, whereas the voltage level compensator 100 is disposed in multiple regions. That is, the voltage level compensator 100 is formed in multiple numbers. This layout prevents supplying of the peripheral circuit voltage VPERI that is usually dropped down to peripheral circuits when the peripheral circuits are located away from the voltage supplier 200.

The peripheral circuit voltage VPERI is dissipated in the peripheral region disposed outside the core blocks. Hence, the voltage generator for the peripheral circuit is configured to include a plurality of voltage compensators disposed at several places of a device to supply the external power supply voltage to the terminal connected to the peripheral circuit voltage after detecting the supply of a command that is expected to cause high current consumption. As a result, it is possible to reduce the voltage drop down incidence caused by the column path operation and the remote distance from the level compensator to the voltage supplier. Accordingly, the voltage generator can stably supply the peripheral circuit voltage regardless of the high current consumption and the device layout.

The present application contains a subject matter related to the Korean patent application Nos. KR 2005-090843 and 2005-0123980, filed in the Korean Patent Office respectively on Sep. 28, 2005, and Dec. 15, 2005, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A microchip, comprising:
   a plurality of memory core blocks, and
   a voltage generator for a peripheral circuit, the voltage generator comprising:
   a single voltage supplier, included on the microchip, configured to supply a peripheral circuit voltage on an output having a voltage level maintained at a reference voltage level, the peripheral circuit voltage outputted in response to a driving signal, wherein the single voltage supplier includes a single inverter with an input connected to a driving signal; and
   a plurality of voltage level compensators configured to increase the voltage level of the peripheral circuit voltage in response to a column path command, wherein the plurality of voltage level compensators are connected in parallel to the single voltage supplier output,
   wherein each of the plurality of voltage level compensators comprise a driving unit driving the terminal connected to the peripheral circuit voltage with an external power supply voltage and a control unit generating a driving control signal in response to the column path command and a deep power down mode signal to control the driving unit
   wherein the plurality of voltage level compensators increase the voltage level of the peripheral circuit voltage during a read or write operation, and
   wherein the increased peripheral circuit voltage is used by the read and write operations of the peripheral circuit.

2. The microchip of claim 1, wherein the plurality of voltage level compensators drive the terminal of the peripheral circuit voltage with the external power supply voltage when the column path command is enabled, and stops supplying the external power supply voltage when a deep power down mode signal is enabled.

3. The microchip of claim 2, wherein the control unit comprises:
   an inverter inverting the deep power down mode signal; and
   a logic gate receiving the column path command and an output signal of the inverter and outputting the driving control signal.

4. The microchip of claim 3, wherein the driving unit comprises a P-channel metal-oxide semiconductor (PMOS) transistor, the PMOS transistor receiving the driving control signal through a gate thereof and coupled between a terminal connected to the external power supply voltage and the terminal connected to the peripheral circuit voltage.

5. The microchip of claim 4, wherein the column path command is enabled when one of a read command and a write command is supplied.

6. The microchip of claim 5, wherein each of the plurality of the voltage level compensators is disposed in a separate region of the peripheral circuit and the voltage supplier is disposed in a single region of the peripheral circuit.

* * * * *